United States Patent
Honda (10) Patent No.: US 7,169,474 B2
(45) Date of Patent: Jan. 30, 2007

(54) EPOXY RESIN COMPOSITION AND SEMICONDUCTOR DEVICE

(75) Inventor: Tsuyoshi Honda, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 356 days.

(21) Appl. No.: 10/771,358

(22) Filed: Feb. 5, 2004

(65) Prior Publication Data

US 2004/0155334 A1    Aug. 12, 2004

(30) Foreign Application Priority Data

Feb. 6, 2003    (JP)    ............... 2003-029510

(51) Int. Cl.
  *B32B 27/38*    (2006.01)
  *H01L 21/56*    (2006.01)
  *C08L 63/00*    (2006.01)
  *C08L 83/04*    (2006.01)

(52) U.S. Cl. ............ 428/413; 438/127; 523/445; 523/451; 525/476

(58) Field of Classification Search .............. None
See application file for complete search history.

(56) References Cited

U.S. PATENT DOCUMENTS

| | | | |
|---|---|---|---|
| 3,791,027 A * | 2/1974 | Angelo et al. | 228/223 |
| 6,306,792 B1 * | 10/2001 | Miyake et al. | 502/155 |
| 6,429,238 B1 * | 8/2002 | Sumita et al. | 523/461 |
| 2003/0164555 A1 * | 9/2003 | Tong et al. | 257/787 |

OTHER PUBLICATIONS

Zhang et al, Study of Non-Anhydride Curing System for No-Flow Underfill Applications, IEEE Electronic Components and Technology Conference, 2001, p. 1474-1478.

* cited by examiner

*Primary Examiner*—Michael J. Feely
(74) *Attorney, Agent, or Firm*—Birch, Stewart, Kolasch & Birch, LLP (57) ABSTRACT

An epoxy resin composition comprising (A) an epoxy resin, (B) a phenolic resin, (C) a curing accelerator, and (D) an effective flux component selected from among abietic acid, palustric acid, levopimaric acid and dihydroabietic acid is low volatile and exhibits improved wetting and adherent properties to solder balls. The epoxy resin composition is used to cover and encapsulate a semiconductor chip, especially as no-flow underfill material, forming a highly reliable semiconductor device.

11 Claims, 1 Drawing Sheet

EPOXY RESIN COMPOSITION AND SEMICONDUCTOR DEVICE

This Nonprovisional application claims priority under 25 U.S.C. § 119(a) on Patent Application No(s). 2003-029510 filed in JAPAN on Feb. 6, 2003, the entire contents of which are hereby incorporated by reference.

FIELD OF THE INVENTION

This invention relates to epoxy resin compositions having low volatility and improved wetting and adherent properties to solder balls and suited for use as the no-flow underfill material, and semiconductor devices encapsulated therewith.

BACKGROUND ART

Due to their adhesion, heat resistance and moisture resistance, epoxy resins have many applications for use as adhesives and paints, and also in the advanced technology field as semiconductor device encapsulants. In particular, liquid epoxy resins have undergone a drastic expansion of their applicable areas in the semiconductor field which is in progress toward smaller feature size and higher operating speed, since they can be adapted to the requirements of ultra-fine complex device design. One of the most developing areas for epoxy resins is the flip chip underfill material.

In the current drive for higher operating speeds and integration density, the chip design targets on low-profile large-size chips. To this end, the conventional capillary flow process in which liquid epoxy resin infiltrates into narrow gaps by utilizing the capillary phenomenon has reached a certain limit. Replacement processes have been proposed, one of which is the no-flow underfill process. In this process, an underfill material is applied to a substrate, a chip is placed on the substrate, and the assembly is heated to achieve conduction between the chip and the substrate and cure of the underfill at the same time.

The no-flow underfill material must have different properties from those of the capillary flow underfill, for example, low volatility and wetting and adherent properties to solder balls. In achieving conduction between the chip and the substrate, the underfill material is heated to an elevated temperature above the melting point of solder balls, typically a temperature of 200° C. or higher. Thus, the underfill material should have a minimum volatile content. In order that a satisfactory interface without imperfections (unfilled or separated) be established between the underfill and solder balls, the underfill is required to exert satisfactory wetting and adherent properties to the molten solder balls. The current capillary flow underfill materials, which are cured at relatively low temperatures after solder bonding, do not possess the low volatility and solder ball wetting, failing to comply with the no-flow process.

With respect to the no-flow underfill, reference should be made to Zhuqing Zhang, Lianhua Fan, C. P. Wong, IEEE Electronic Components and Technology Conference, 2001, p. 1474.

SUMMARY OF THE INVENTION

An object of the invention is to provide an epoxy resin composition having low volatility and improved wetting and adherent properties to solder balls and suited for use as the no-flow underfill material, and a semiconductor device encapsulated therewith.

The inventor has discovered that an epoxy resin composition comprising as essential components (A) an epoxy resin, (B) a phenolic resin, (C) a curing accelerator, preferably a compound of the following general formula (5), and (D) an effective flux component in the form of at least one selected from abietic acid and derivatives thereof having the following formulae (1) to (4) is low volatile because the phenolic resin is used as a curing agent for the epoxy resin and exhibits improved wetting and adherent properties to solder balls because the organic acid to act effectively as the flux for solder balls is added. This epoxy resin composition is useful as the encapsulant for semiconductor devices, especially as no-flow underfill material.

Accordingly, in one aspect, the present invention provides an epoxy resin composition comprising as essential components:

(A) an epoxy resin,
(B) a phenolic resin,
(C) a curing accelerator for components (A) and (B), and
(D) an effective flux component in the form of at least one selected from abietic acid and derivatives thereof having the following formulae (1) to (4).

Abietic acid (1)

Palustric acid (2)

Levopimaric acid (3)

-continued

Dihydroabietic acid

In a preferred embodiment, component (C) is a compound of the general formula (5).

Herein $R^1$ to $R^8$ each are a substituted or unsubstituted monovalent hydrocarbon group having 1 to 10 carbon atoms, which may contain a hydroxyl or alkoxy group.

In another preferred embodiment, the epoxy resin composition may further include a copolymer obtained through reaction of an aromatic polymer with an organopolysiloxane of the average compositional formula (6).

Herein $R^9$ is hydrogen, an organic group containing amino, epoxy, hydroxy or carboxy, or an alkoxy group, $R^{10}$ is a substituted or unsubstituted monovalent hydrocarbon group, hydroxy group, alkoxy group or alkenyloxy group, "a" is a positive number of 0.001 to 1, "b" is a positive number of 1 to 3, satisfying $1 \leq a+b \leq 4$, the number of silicon atoms per molecule is 1 to 1,000, and the number of $R^9$ groups directly attached to silicon atoms per molecule is at least 1.

In a second aspect, the invention provides a semiconductor device which is encapsulated with the above-described epoxy resin composition in the cured state, typically a flip-chip type semiconductor device which is sealed with the epoxy resin composition in the cured state as an underfill material.

BRIEF DESCRIPTION OF THE DRAWINGS

FIG. 1 illustrates a test to determine the wetting of a solder ball with a resin composition of the invention, FIG. 1a being a perspective view of a test piece and FIG. 1b being a cross-sectional view of the test piece, indicating a contact angle.

DESCRIPTION OF THE PREFERRED EMBODIMENT

Component (A) is an epoxy resin which is not particularly limited with respect to its structure, viscosity and the like. Any well-known epoxy resins may be used. Suitable epoxy resin structures include, but are not limited to, novolac, bisphenol, biphenyl, phenol aralkyl, dicyclopentadiene and naphthalene types and amino group-containing type. Among others, bisphenol A and bisphenol F types are preferred. They may be used alone or in admixture of two or more. The epoxy resin should desirably have such a viscosity that it is liquid at room temperature, specifically a viscosity at 25° C. of up to 100 Pa·s, especially up to 10 Pa·s.

Component (B) is a phenolic resin which is not particularly limited with respect to its structure, viscosity and the like. Any well-known phenolic resins may be used. Suitable phenolic resin structures include, but are not limited to, phenol novolac, cresol novolac, trishydroxyphenylmethane, naphthalene, cyclopentadiene and phenol aralkyl types. They may be used alone or in admixture of two or more. The phenolic resin should desirably have a viscosity at 150° C. of up to 10 Pa·s, especially up to 1 Pa·s.

In the invention, the curing agent for epoxy resins is limited to phenolic resins for the purpose of reducing the volatile content. Although acid anhydrides, aromatic amines and the like are known as the curing agent for epoxy resins, they are more volatile because of weak intermolecular forces as compared with the phenolic resins, despite approximately equal molecular weight and viscosity, so that these volatile components can generate voids when the composition is cured, especially in the step of melting solder balls. Among phenolic resins, those containing more monomers are relatively volatile. Then phenolic resins containing no or little monomers are desirable. Specifically, phenol novolac resins or cresol novolac resins which are essentially devoid of monomers are more desirable.

Component (C) is a cure accelerator which is preferably a compound of the general formula (5).

Herein $R^1$ to $R^8$ each are a substituted or unsubstituted monovalent hydrocarbon group having 1 to 10 carbon atoms, which may contain a hydroxyl or alkoxy group.

Examples of the monovalent hydrocarbon groups represented by $R^1$ to $R^8$ include alkyl groups such as methyl, ethyl, n-propyl, isopropyl, n-butyl, isobutyl, tert-butyl, pentyl, neopentyl, hexyl, cyclohexyl, octyl, and decyl, alkenyl groups such as vinyl, allyl, propenyl, and butenyl, aryl groups such as phenyl and tolyl, aralkyl groups such as benzyl and phenylethyl, and halo-substituted monovalent hydrocarbon groups in which some or all of the hydrogen atoms on the foregoing hydrocarbon groups are substituted with halogen atoms (e.g., fluoro, chloro and bromo), hydroxyl-substituted monovalent hydrocarbon groups in which hydrogen atoms are substituted with hydroxyl groups, and alkoxy-substituted monovalent hydrocarbon groups in which hydrogen atoms are substituted with alkoxy groups such as methoxy, ethoxy and phenoxy. Each of $R^1$ to $R^8$ is independently selected from these groups.

Illustrative examples of the cure accelerator (C) are given below.

The cure accelerator (C) is desirably added in an amount of 0.1 to 10 parts, more desirably 0.5 to 5 parts by weight per 100 parts by weight of resin components [total of components (A) and (B) and the copolymer to be described later]. On this basis, less than 0.1 part of the cure accelerator may lead to under-cure whereas more than 10 parts of the cure accelerator may be detrimental to storage stability.

Component (D) is an effective flux component which is one or more compounds selected from abietic acid and derivatives thereof having the following formulae (1) to (4).

(1)

Abietic acid (2)

Palustric acid (3)

Levopimaric acid (4)

Dihydroabietic acid

The effective flux component (D) is desirably added in an amount of 0.1 to 10 parts, more desirably 0.5 to 5 parts by weight per 100 parts by weight of resin components [total of components (A) and (B) and the copolymer to be described later]. On this basis, less than 0.1 part of the flux component may fail to exert its effect, that is, failing to provide wetting and adhesion between solder balls and the underfill material and allowing imperfections (unfilled or separated) to develop at their interface. More than 10 parts of the flux component may interfere with curing, resulting in reduced resistance to heat and moisture.

It is not critical how to add the effective flux component. Desirably, the effective flux component is heat mixed with the epoxy resin or phenolic resin for uniform dispersion therein prior to mixing all the components together.

To the epoxy resin composition, a copolymer obtained through reaction of an aromatic polymer with an organopolysiloxane is added, if necessary. This copolymer serves as a stress reducing agent.

The aromatic polymers used herein include phenolic resins or epoxy resins having the general formula (7) or (8) and alkenyl-containing phenolic resins or epoxy resins having the general formulae (9) to (12).

(7)

(8)

In formulae (7) and (8), $R^{11}$ is hydrogen or a glycidyl group of the formula:

$R^{12}$ is hydrogen or methyl, X is hydrogen or bromine, and n is an integer inclusive of 0, preferably an integer of 0 to 50, more preferably an integer of 1 to 20.

(9)

(10)

-continued (11)

(12)

In formulae (9) to (12), $R^{11}$ is hydrogen or a glycidyl group of the formula:

$R^{12}$ is hydrogen or methyl, $R^{13}$ is a group:

and arbitrarily selected from them for each position within the molecule, X is hydrogen or bromine, n is an integer inclusive of 0, preferably an integer of 0 to 50, more preferably an integer of 1 to 20, and m is an integer inclusive of 0, preferably an integer of 0 to 5, more preferably 0 or 1.

On the other hand, the organopolysiloxane is of the average compositional formula (6):

$$(R^9)_a(R^{10})_b SiO_{(4-a-b)/2} \quad (6)$$

wherein $R^9$ is hydrogen, an organic group containing amino, epoxy, hydroxy or carboxy, or an alkoxy group, $R^{10}$ is a substituted or unsubstituted monovalent hydrocarbon group, hydroxy group, alkoxy group or alkenyloxy group, "a" is a positive number of 0.001 to 1, and "b" is a positive number of 1 to 3, satisfying $1 \leq a+b \leq 4$. The number of silicon atoms per molecule is 1 to 1,000. The number of $R^9$ groups directly attached to silicon atoms per molecule is at least 1.

Examples of the amino-containing organic group represented by $R^9$ are given below.

Herein, c is 1, 2 or 3.

Examples of the epoxy-containing organic group represented by $R^9$ are given below.

Herein, d is 1, 2 or 3.

Examples of the hydroxy-containing organic group represented by $R^9$ are given below.

Herein, e is 0, 1, 2 or 3 and f is 1, 2 or 3.

Examples of the carboxy-containing organic group represented by $R^9$ are given below.

Herein, g is an integer of 0 to 10.

Suitable alkoxy groups are those of 1 to 4 carbon atoms, such as methoxy, ethoxy and n-propoxy.

Preferred monovalent hydrocarbon groups represented by $R^{10}$ are those of 1 to 10 carbon atoms, including alkyl groups such as methyl, ethyl, n-propyl, isopropyl, n-butyl, isobutyl, tert-butyl, pentyl, neopentyl, hexyl, cyclohexyl, octyl, and decyl, alkenyl groups such as vinyl, allyl, propenyl, and butenyl, aryl groups such as phenyl and tolyl, and aralkyl groups such as benzyl and phenylethyl. Also included are halo-substituted monovalent hydrocarbon groups in which some or all of the hydrogen atoms on the foregoing hydrocarbon groups are substituted with halogen atoms, and otherwise substituted monovalent hydrocarbon groups.

The subscripts "a" and "b" have values as defined above and are preferably positive numbers satisfying $0.01 \leq a \leq 0.1$, $1.8 \leq b \leq 2$ and $1.85 \leq a+b \leq 2.1$. The number of silicon atoms per molecule is 1 to 1,000, desirably 10 to 400, more desirably 20 to 210.

Suitable organopolysiloxanes include those of the general formula (13) or (14).

(13)

(14)

Herein $R^{14}$ is a monovalent hydrocarbon group containing amino, epoxy, hydroxy or carboxy, $R^{15}$ is a substituted or unsubstituted monovalent hydrocarbon group as defined for $R^{10}$, preferably methyl or phenyl, p is an integer of 0 to 1,000, preferably 8 to 400, and q is an integer of 0 to 20, preferably 0 to 5.

Illustrative examples of the organopolysiloxane are given below.

The weight average molecular weight of the organopolysiloxane having the average compositional formula (6) is not particularly limited although it is preferably in the range of 100 to 70,000. When a copolymer obtained from an organopolysiloxane having a molecular weight of 100 to 70,000 is blended in the epoxy resin composition, the copolymer is not compatibilized in the matrix and instead, forms a fine island-in-sea structure. A copolymer obtained from an organopolysiloxane having a molecular weight of less than 100 is compatibilized in the matrix and does not form an island-in-sea structure. A copolymer obtained from an organopolysiloxane having a molecular weight of more than 70,000 forms a large island-in-sea structure. Either case may lead to a failure to reduce the stress of cured composition.

Any well-known method may be employed in reacting an aromatic polymer with an organopolysiloxane to form a copolymer.

The copolymer is preferably added in an amount of 0 to 80% by weight, more preferably 10 to 50% by weight based on the total weight of resin components [total of components (A) and (B) plus the copolymer]. Too small amounts of the copolymer may be ineffective, that is, failing to further reduce the stress of cured composition, whereas too large amounts of the copolymer may bring a viscosity build-up to an uncured composition or cause a cured composition to lose heat resistance.

In the epoxy resin composition of the invention, the epoxy resin and the phenolic resin are desirably combined such that the equivalent ratio of epoxy resin to phenolic resin may range from 0.8 to 1.25, especially from 0.9 to 1.1. If the equivalent ratio of epoxy resin to phenolic resin is outside the range, some resin may be left unreacted, which is detrimental to the performance of cured composition or the performance of semiconductor devices using the same. As used herein, the epoxy resin is the epoxy resin as component (A) plus any epoxy component if the copolymer has epoxy groups; and the phenolic resin is the phenolic resin as component (B) plus any phenolic component if the copolymer has phenolic hydroxyl groups.

Optional additives may be added to the epoxy resin composition of the invention, depending on a particular application, and insofar as the objects of the invention are not compromised. Suitable additives include inorganic fillers such as silica, alumina, talc, mica, silicon nitride, boron nitride and silver, flame retardants, ion-trapping agents, wax, colorants, adhesive aids and the like.

The foregoing components are combined and mixed in a customary manner to form an epoxy resin composition of the invention. Mixers, roll mills and extruders of different types may be used. The order of mixing and mixing conditions including time, temperature and pressure may be controlled if necessary.

Preferably, the epoxy resin composition of the invention has a volatile content of less than 0.4 wt %, especially up to 0.2 wt % when heated at 150° C. for one hour. If more volatiles are contained, such volatiles would generate voids when the composition is cured, especially during the step of melting solder balls.

Also preferably, the epoxy resin composition has a viscosity at 25° C. of 100 to 1,000 Pa·s, especially 300 to 600 Pa·s.

The epoxy resin composition may be formed into articles by any conventional method under customary conditions, preferably at an elevated temperature of 200° C. or higher. In heating the composition, a flip-chip bonder or IR reflow furnace is used which is capable of temperature control.

The epoxy resin composition of the invention is extremely low volatile because the phenolic resin is used as a curing agent for the epoxy resin and exhibits improved wetting and adherent properties to solder balls because the organic acid to act effectively as the flux for solder balls is added. The epoxy resin composition is thus useful as the encapsulant for semiconductor devices, especially no-flow underfill material.

EXAMPLE

Examples are given below to illustrate the invention, but are not intended to limit the scope of the invention.

Examples 1–12 & Comparative Examples 1–3

The components shown below were combined as shown in Tables 1 to 3, and mixed in a mixer to yield resin compositions of Examples 1–12 and Comparative Examples 1–3. The flux component was previously dissolved in the curing agent. Tests (a) to (g) were carried out on these resin compositions, with the results being shown in Tables 1 to 3.

Epoxy resin A: bisphenol A epoxy resin, equivalent 170
Epoxy resin B: bisphenol F epoxy resin, equivalent 155
Epoxy resin C: naphthalene type epoxy resin of formula (15) below, equivalent 136

(15)

Phenolic resin D: phenol novolac resin, equivalent 110

Phenolic resin E: cresol novolac resin, equivalent 125

Curing agent F: a 7/3 mixture of 4-methyltetrahydrophthalic acid anhydride/tetrahydrophthalic acid anhydride of formula (16) below, equivalent 172

(16)

Curing agent G: bis(4-amino-3,5-dimethylphenyl)methane of formula (17) below, equivalent 64

(17)

Cure accelerator H: tetraphenylphosphine-tetraphenyl borate of formula (18) below (18)

Cure accelerator I: tetratoluylphosphine-tetraphenyl borate of formula (19) below (19)

Cure accelerator J: tetraphenylphosphine-tetratoluyl borate of formula (20) below

(20)

-continued

Stress reducing agent K: copolymer of aromatic polymer of formula (21) with organopolysiloxane of formula (22), white solid, weight average molecular weight 3,800, epoxy equivalent 291

(21)

(22)

r:s=19:1, r+s=5 on average, arbitrary order of recurring units

Stress reducing agent L: copolymer of aromatic polymer of formula (23) with organopolysiloxane of formula (24), white solid, weight average molecular weight 2,600, phenolic hydroxyl equivalent 336

(23)

(24)

t:u=4:1, t+u=3 on average, arbitrary order of recurring units

Flux M: abietic acid of formula (1) below (1)

Flux N: palustric acid of formula (2) below (2)

Flux O: levopimaric acid of formula (3) below (3)

Flux P: dihydroabietic acid of formula (4) below (4)

Silica: spherical fused silica, average particle size 2 μm, maximum particle size 10 μm Carbon black: Denka Black, trade name of Denki Kagaku Kogyo K.K.

KBM-403: γ-glycidoxypropyltrimethoxysilane, silane coupling agent by Shin-Etsu Chemical Co., Ltd.

(a) Viscosity of Uncured Composition

The viscosity at 25° C. of an uncured composition was measured according to JIS K7117.

(b) Volatile Content of Uncured Composition

A resin composition, 3 g, was dropped on an aluminum dish and heated in an oven at 150° C. for one hour. The volatile content was computed from the weights before and after the heating.

(c) Wetting of Solder Balls

Figures 1A, 1B:
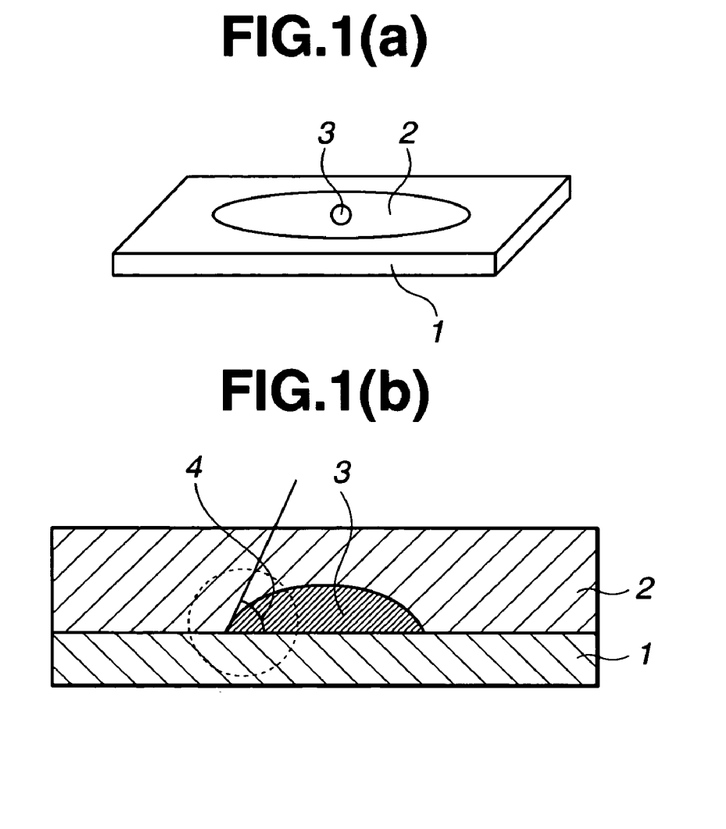

As shown in FIG. 1a, 0.5 g of a resin composition 2 was dropped on a copper plate 1, after which a solder ball 3 (Sn/Ag/Cu=96.5/3.0/0.5) having a diameter of 0.76 mm was placed thereon. The plate was passed through an IR reflow furnace (maximum temperature 260° C.). From a sectional photograph of the cured structure as shown in FIG. 1b, a contact angle 4 was determined.

(d) Voids After Mounting

Figure 2:
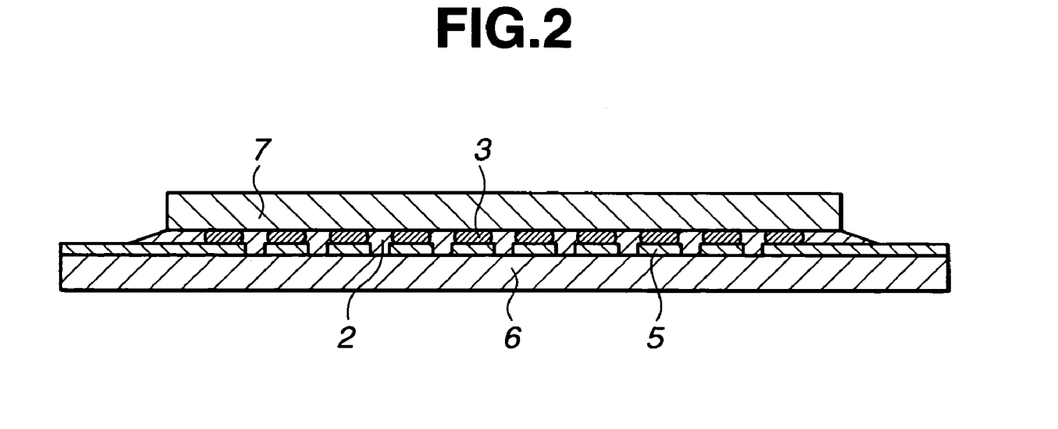
FIG. 2 is a schematic cross-sectional view of a semiconductor device in a void test.

As shown in FIG. 2, a resin composition 2 was dropped on a BT substrate 6 having copper electrode strips 5 formed thereon. A chip 7 having solder balls 3 (Sn/Ag/Cu=96.5/3.0/0.5) borne thereon was placed thereon. By treatment under conditions: 230° C., 0.1 MPa, 10 seconds, the solder balls 3 were temporarily secured. The assembly was passed through an IR reflow furnace (maximum temperature 260° C.), yielding a semiconductor device.

Using an ultrasonic flaw detector, the semiconductor device was observed for the presence of voids in the resin. The number of voided chips per total 20 chips is reported.

(e) Thermal Cycling Test

Ten chips in which no voids in the resin were found in test (d) were subjected to a thermal cycling test of repeating 500, 1000 and 2000 cycles of −60° C./10 min cooling and 150° C./10 min heating. The number of cracked or separated chips per total 10 chips is reported.

(f) Reflow Test After Moisture Absorption

Ten chips in which no voids in the resin were found in test (d) were held under conditions: 85° C., RH 85%, 168 hours for moisture absorption and then passed through an IR reflow furnace (maximum temperature 245° C.). The number of cracked or separated chips per total 10 chips is reported.

(g) Conduction Test After Mounting

A conduction test was performed on semiconductor devices fabricated as in test (d). The number of conducting chips per total 20 chips is reported.

TABLE 1

| Compounding amount (pbw) | | Example | | | | | |
|---|---|---|---|---|---|---|---|
| | | 1 | 2 | 3 | 4 | 5 | 6 |
| Epoxy resin A | | 39.8 | 0 | 0 | 37.0 | 0 | 0 |
| Epoxy resin B | | 0 | 38.3 | 0 | 0 | 35.6 | 0 |
| Epoxy resin C | | 0 | 0 | 36.2 | 0 | 0 | 33.5 |
| Phenolic resin D | | 35.2 | 36.7 | 38.8 | 0 | 0 | 0 |
| Phenolic resin E | | 0 | 0 | 0 | 38.0 | 39.4 | 41.5 |
| Curing agent F | | 0 | 0 | 0 | 0 | 0 | 0 |
| Curing agent G | | 0 | 0 | 0 | 0 | 0 | 0 |
| Cure accelerator H | | 1 | 1 | 1 | 1 | 1 | 1 |
| Cure accelerator I | | 0 | 0 | 0 | 0 | 0 | 0 |
| Cure accelerator J | | 0 | 0 | 0 | 0 | 0 | 0 |
| Stress reducing agent K | | 25 | 25 | 25 | 25 | 25 | 25 |
| Stress reducing agent L | | 0 | 0 | 0 | 0 | 0 | 0 |
| Flux M | | 2 | 2 | 2 | 2 | 2 | 2 |
| Flux N | | 0 | 0 | 0 | 0 | 0 | 0 |
| Flux O | | 0 | 0 | 0 | 0 | 0 | 0 |
| Flux P | | 0 | 0 | 0 | 0 | 0 | 0 |
| Silica | | 105 | 105 | 105 | 105 | 105 | 105 |
| Carbon black | | 1 | 1 | 1 | 1 | 1 | 1 |
| KBM-403 | | 1 | 1 | 1 | 1 | 1 | 1 |
| Test results | | | | | | | |
| (a) Viscosity of uncured composition (Pa.s) | | 550 | 430 | 590 | 490 | 350 | 510 |
| (b) Volatile content of uncured composition (%) | | 0.14 | 0.15 | 0.12 | 0.16 | 0.18 | 0.14 |
| (c) Wetting of solder balls (deg) | | 27 | 25 | 28 | 26 | 22 | 27 |
| (d) Voids after mounting | | 0/20 | 0/20 | 0/20 | 0/20 | 0/20 | 0/20 |
| (e) Thermal cycling test | 500 cycles | 0/10 | 0/10 | 0/10 | 0/10 | 0/10 | 0/10 |
| | 1000 cycles | 0/10 | 0/10 | 0/10 | 0/10 | 0/10 | 0/10 |
| | 2000 cycles | 0/10 | 0/10 | 0/10 | 0/10 | 0/10 | 0/10 |
| (f) Reflow test after moisture absorption | | 0/10 | 0/10 | 0/10 | 0/10 | 0/10 | 0/10 |
| (g) Conduction test after mounting | | 20/20 | 20/20 | 20/20 | 20/20 | 20/20 | 20/20 |

TABLE 2

| Compounding amount (pbw) | Example 7 | Example 8 | Example 9 | Example 10 | Example 11 | Example 12 |
|---|---|---|---|---|---|---|
| Epoxy resin A | 39.8 | 39.8 | 50.5 | 39.8 | 39.8 | 39.8 |
| Epoxy resin B | 0 | 0 | 0 | 0 | 0 | 0 |
| Epoxy resin C | 0 | 0 | 0 | 0 | 0 | 0 |
| Phenolic resin D | 35.2 | 35.2 | 24.5 | 35.2 | 35.2 | 35.2 |
| Phenolic resin E | 0 | 0 | 0 | 0 | 0 | 0 |
| Curing agent F | 0 | 0 | 0 | 0 | 0 | 0 |
| Curing agent G | 0 | 0 | 0 | 0 | 0 | 0 |
| Cure accelerator H | 0 | 0 | 1 | 1 | 1 | 1 |
| Cure accelerator I | 1 | 0 | 0 | 0 | 0 | 0 |
| Cure accelerator J | 0 | 1 | 0 | 0 | 0 | 0 |
| Stress reducing agent K | 25 | 25 | 0 | 25 | 25 | 25 |
| Stress reducing agent L | 0 | 0 | 25 | 0 | 0 | 0 |
| Flux M | 2 | 2 | 2 | 0 | 0 | 0 |
| Flux N | 0 | 0 | 0 | 2 | 0 | 0 |
| Flux O | 0 | 0 | 0 | 0 | 2 | 0 |
| Flux P | 0 | 0 | 0 | 0 | 0 | 2 |
| Silica | 105 | 105 | 105 | 105 | 105 | 105 |
| Carbon black | 1 | 1 | 1 | 1 | 1 | 1 |
| KBM-403 | 1 | 1 | 1 | 1 | 1 | 1 |
| Test results | | | | | | |
| (a) Viscosity of uncured composition (Pa.s) | 540 | 570 | 480 | 550 | 560 | 560 |
| (b) Volatile content of uncured composition (%) | 0.13 | 0.10 | 0.18 | 0.15 | 0.17 | 0.18 |
| (c) Wetting of solder balls (deg) | 28 | 31 | 23 | 29 | 28 | 31 |
| (d) Voids after mounting | 0/20 | 0/20 | 0/20 | 0/20 | 0/20 | 0/20 |
| (e) Thermal cycling test 500 cycles | 0/10 | 0/10 | 0/10 | 0/10 | 0/10 | 0/10 |
| 1000 cycles | 0/10 | 0/10 | 0/10 | 0/10 | 0/10 | 0/10 |
| 2000 cycles | 0/10 | 0/10 | 0/10 | 0/10 | 0/10 | 0/10 |
| (f) Reflow test after moisture absorption | 0/10 | 0/10 | 0/10 | 0/10 | 0/10 | 0/10 |
| (g) Conduction test after mounting | 20/20 | 20/20 | 20/20 | 20/20 | 20/20 | 20/20 |

TABLE 3

| Compounding amount (pbw) | Comparative Example 1 | Comparative Example 2 | Comparative Example 3 |
|---|---|---|---|
| Epoxy resin A | 29.9 | 50.5 | 39.8 |
| Epoxy resin B | 0 | 0 | 0 |
| Epoxy resin C | 0 | 0 | 0 |
| Phenolic resin D | 0 | 0 | 35.2 |
| Phenolic resin E | 0 | 0 | 0 |
| Curing agent F | 45.1 | 0 | 0 |
| Curing agent G | 0 | 24.5 | 0 |
| Cure accelerator H | 1 | 1 | 0 |
| Cure accelerator I | 0 | 0 | 0 |
| Cure accelerator J | 0 | 0 | 0 |
| Stress reducing agent K | 25 | 25 | 25 |
| Stress reducing agent L | 0 | 0 | 0 |
| Flux M | 2 | 2 | 0 |
| Flux N | 0 | 0 | 0 |
| Flux O | 0 | 0 | 0 |
| Flux P | 0 | 0 | 0 |
| Silica | 105 | 105 | 103 |
| Carbon black | 1 | 1 | 1 |
| KBM-403 | 1 | 1 | 1 |
| Test results | | | |
| (a) Viscosity of uncured composition (Pa·s) | 270 | 320 | 520 |
| (b) Volatile content of uncured composition (%) | 0.53 | 0.47 | 0.13 |
| (c) Wetting of solder balls (deg) | 23 | 24 | 75 |
| (d) Voids after mounting | 18/20 | 15/20 | 0/20 |
| (e) Thermal cycling test 500 cycles | 8/10 | 6/10 | 10/10 |
| 1000 cycles | 10/10 | 10/10 | 10/10 |
| 2000 cycles | 10/10 | 10/10 | 10/10 |
| (f) Reflow test after moisture absorption | 10/10 | 10/10 | 10/10 |
| (g) Conduction test after mounting | 20/20 | 20/20 | 5/20 |

There have been described epoxy resin compositions which are extremely low volatile and exhibit improved wetting and adherent properties to solder balls. When the epoxy resin compositions are used to cover and encapsulate surfaces of semiconductor chips, especially as no-flow underfill material, highly reliable semiconductor devices are obtained.

Japanese Patent Application No. 2003-029510 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An epoxy resin composition comprising
(A) an epoxy resin,
(B) a phenolic resin, (C) a curing accelerator for components (A) and (B), which is a compound of the general formula (5):

(5)

wherein $R^1$ to $R^8$ each are a substituted or unsubstituted monovalent hydrocarbon group having 1 to 10 carbon atoms, which may contain a hydroxyl or alkoxy group, and

(D) an effective flux component in the form of at least one compound selected from abietic acid and derivatives thereof having the following formulae (1) to (4)

(1)

Abietic acid (2)

Palustric acid (3)

Levopimaric acid (4)

Dihydroabietic acid

2. The epoxy resin composition of claim 1, further comprising a copolymer obtained through reaction of an aromatic polymer with an organopolysiloxane of the average compositional formula (6):

$$(R^9)_a(R^{10})_b SiO_{(4-a-b)/2}$$ (6)

wherein $R^9$ is hydrogen, an organic group containing amino, epoxy, hydroxy or carboxy, or an alkoxy group, $R^{10}$ is a substituted or unsubstituted monovalent hydrocarbon group, hydroxy group, alkoxy group or alkenyloxy group, "a" is a positive number of 0.001 to 1, "b" is a positive number of 1 to 3, satisfying $1 \leq a+b \leq 4$, the number of silicon atoms per molecule is 1 to 1,000, and the number of $R^9$ groups directly attached to silicon atoms per molecule is at least 1.

3. A semiconductor device which is encapsulated with the epoxy resin composition of claim 1, or 2 in the cured state.

4. A flip-chip type semiconductor device which is encapsulated with the epoxy resin composition of claim 1, or 2 in the cured state as an underfill material.

5. The epoxy resin composition of claim 2, wherein said organopolysiloxane has the formula (13) or (14)

(13)

(14)

wherein $R^{14}$ is a monocalent hydrocarbon group containing amino, epoxy, hydroxy, or carboxy, $R^{15}$ is a substituted or unsubstituted monovalent hydrocarbon group, p is an integer of 0 to 1,000, and q is an integer of 0 to 20.

6. The epoxy resin composition of claim 5, wherein said organopolysiloxane has a weight average molecular weight in the range of 100 to 70,000.

7. The epoxy resin composition of claim 1, herein curing accelerator (C) has the formula (18), (19), or (20)

(18)

-continued

(19)

(20)

8. The epoxy resin composition of claim 1, wherein flux component (D) has formula (1) below (1)

9. The epoxy resin composition of claim 1, wherein flux component (D) has formula (2) below (2)

10. The epoxy resin composition of claim 1, wherein flux component (D) has formula (2) below (3)

11. The epoxy resin composition of claim 1, wherein flux component (D) has formula (4) below (4)

* * * * *